United States Patent
Poletto et al.

(10) Patent No.: US 10,983,151 B2
(45) Date of Patent: *Apr. 20, 2021

(54) RESISTIVE-SENSOR INTERFACE

(71) Applicant: STMicroelectronics S.r.l., Agrate Brianza (IT)

(72) Inventors: Vanni Poletto, Milan (IT); Nicola Rogledi, Pavia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/521,415

(22) Filed: Jul. 24, 2019

(65) Prior Publication Data
US 2019/0346497 A1    Nov. 14, 2019

Related U.S. Application Data

(63) Continuation of application No. 15/261,126, filed on Sep. 9, 2016, now Pat. No. 10,401,408.

(30) Foreign Application Priority Data

Feb. 8, 2016    (IT) .................. 102016000012535

(51) Int. Cl.
*G01R 27/14* (2006.01)
*H03M 3/00* (2006.01)

(52) U.S. Cl.
CPC .......... *G01R 27/14* (2013.01); *H03M 3/458* (2013.01)

(58) Field of Classification Search
CPC ....... G01R 27/14; G01R 27/02; H03M 3/458; H03M 1/12
See application file for complete search history.

(56) References Cited

U.S. PATENT DOCUMENTS

| 5,206,649 | A | * | 4/1993 | Gulczynski | ........... | H03M 1/162 |
|---|---|---|---|---|---|---|
| | | | | | | 341/156 |
| 6,975,103 | B1 | | 12/2005 | Blom | | |
| 10,401,408 | B2 | * | 9/2019 | Poletto | .................. | H03M 3/458 |
| 2011/0001502 | A1 | | 1/2011 | Walker | | |
| 2012/0191398 | A1 | | 7/2012 | Murakami et al. | | |

(Continued)

FOREIGN PATENT DOCUMENTS

| CN | 1051426 A | 5/1991 |
|---|---|---|
| CN | 1126514 A | 7/1996 |

(Continued)

OTHER PUBLICATIONS

Gureyev et al., "Improvement of the Current Loop Circuit for AC and DC Applications Based on Digital Signal Processing," ITMC 2006—Instrumentation and Measurement Technology Conference, Sorrento, Italy, Apr. 24-27, 2006, pp. 1257-1261.

*Primary Examiner* — Jeff W Natalini
(74) *Attorney, Agent, or Firm* — Seed IP Law Group LLP

(57) ABSTRACT

A device to read a variable resistor has an analog to digital converter (ADC), a first switch and a second switch. The ADC has a first ADC input, a second ADC input and an ADC output. The first switch selectively couples a first voltage indicative of a voltage across a first resistance to the first ADC input. The second switch selectively couples a second voltage indicative of a voltage across a second resistance to the second ADC input. The ADC outputs a signal indicative of a value of the second resistance.

22 Claims, 7 Drawing Sheets

(56) References Cited

U.S. PATENT DOCUMENTS

| | | |
|---|---|---|
| 2012/0256774 A1* | 10/2012 | Dey .................. H03M 1/109 |
| | | 341/120 |
| 2013/0314110 A1 | 11/2013 | McNeill et al. |
| 2014/0340100 A1 | 11/2014 | Popa et al. |
| 2014/0355651 A1 | 12/2014 | Hong et al. |
| 2015/0008931 A1* | 1/2015 | Sugeno .................. B60L 50/60 |
| | | 324/434 |
| 2015/0109155 A1 | 4/2015 | Kon et al. |

FOREIGN PATENT DOCUMENTS

| | | |
|---|---|---|
| CN | 102158085 A | 8/2011 |
| CN | 102829888 A | 12/2012 |
| CN | 104215352 A | 12/2014 |
| CN | 204405739 U | 6/2015 |
| CN | 206490665 U | 9/2017 |
| EP | 0 053 786 A1 | 6/1982 |
| WO | 2006/105421 A2 | 10/2006 |

\* cited by examiner

RESISTIVE-SENSOR INTERFACE

BACKGROUND

Technical Field

The present disclosure relates to measuring an unknown resistance using a reference resistance of a known value.

The measuring of unknown resistances can be applied in the field of sensor electronic interfaces, for example for automotive applications.

Description of the Related Art

The disclosure relates to electronics that manage sensors of a resistive type, for example for the automotive field. The operating principle of these sensors is based upon the variation of an electrical resistance as the physical quantity to be measured varies, with a known law of correspondence, which is possibly proportional.

Examples of physical quantities that can be measured with this type of solution are: level of liquids (fuel, oil, coolant), temperatures, and positions (engines, axles).

The circuit of FIG. 1 measures and converts into a first digital quantity $D_2$ the voltage $V_2$ across an unknown resistance $R_X$ (of unknown value).

Furthermore, the circuit measures and converts into a second digital quantity $D_1$ the voltage $V_1$ across a reference resistance of a known value $R_{REF}$.

The circuit is arranged for calculating the digital representation $D_X$ of the value of the unknown resistance $R_X$, in particular as ratio between the two voltages.

With reference to FIG. 1, the two resistances $R_{REF}$ and $R_X$ are set in series and connected between the supply voltage $V_{SUP}$ and ground gnd. The current $I_X$ that flows in the unknown resistance $R_X$ is $$I_X = \frac{V_1}{R_{REF}}.$$

Consequently, the value of the unknown resistance $R_X$ can be calculated, as a function of the quantities identified in the circuit, as:

$$R_X = \frac{V_2}{I_X} = R_{REF}\frac{V_2}{V_1} = R_{REF}\frac{D_2}{D_1} = R_{REF}D_X$$

where $R_{REF}$ is the value of the known resistance, and $D_X$ is the digital representation of the value of the resistance $R_X$.

The unknown resistance $R_X$ may, for example, be the sensitive element of a generic sensor device, such as for example a temperature sensor or a liquid-level sensor (for fuel or oil).

The two voltages $V_1$ and $V_2$ measured across the two resistances $R_{REF}$ and $R_X$ are supplied to two analog-to-digital converters ADC1 and ADC2. In alternative embodiments, the two analog-to-digital converters ADC1 and ADC2 can be implemented as a single converter ADC, in which the input is multiplexed between the input voltages $V_1$ and $V_2$.

To obtain the result sought, for example it is possible to calculate the ratio between the two voltages across the two resistances considered. In particular, the output of the second A/D converter may be divided by the output of the first A/D converter to supply a value that corresponds to the ratio between the two quantities and that is proportional to the unknown resistance.

The digital representation $D_X$ of the value of the unknown resistance $R_X$ is typically further processed, for example with filtering steps.

The known value of the resistance $R_{REF}$ is considered a scale factor for the digital representation $D_X$ of the value of the unknown resistance $R_X$. Consequently, the operation of multiplication $R_{REF}D_X$ is practically never carried out.

The background art described above corresponds to what is commonly presented in the specifications of the components that contain the function of interface/management of the resistive sensors.

BRIEF SUMMARY

In the scenario outlined previously, there is consequently felt the need for techniques that will provide devices capable of measuring efficiently unknown resistances.

In one or more embodiments, the device for measuring an unknown resistance comprises a reference resistance in series with the unknown resistance, and is arranged for measuring a first voltage and a second voltage, across the reference resistance and the unknown resistance, respectively. The device comprises changeover-switch modules, which receive at input the first and second voltages and supply values representing the first and second voltages, and a single analog-to-digital converter, which supplies at output the digital representation of the value of the unknown resistance as a ratio between the values at input to the converter.

In an embodiment, the analog-to-digital converter contains two negative feedback loops, which function in an alternative way according to the outputs of the changeover-switch modules.

In various embodiments, the negative feedback loops are first-order continuous-time sigma-delta converters.

In an embodiment, alternatively one or the other of the two sigma-delta converters has a constant digital output at a high level.

In various embodiments, each sigma-delta converter comprises an integrator module, a comparator module, and a sequential electronic circuit.

In an embodiment, the sequential electronic circuit is a D flip-flop.

In various embodiments, the changeover-switch modules are multiplexers, and the outputs of the sequential electronic circuits are sent back at input as negative feedback and used as selection input of the multiplexer.

In an embodiment, the outputs of the sequential electronic circuits are filtered and sent at input to a digital divider, which supplies at output the digital representation of the value of the unknown resistance as a ratio between the values representing the first and second voltages.

In an embodiment, a device comprises: an analog to digital converter (ADC) having first ADC input, a second ADC input and an ADC output; a first switch having a first switch input and a first switch output and which, in operation, receives at the first switch input a first voltage indicative of a voltage across a first resistance and selectively couples the first switch input to the first ADC input; a second switch having a second switch input and a second switch output and which, in operation, receives at the second switch input a second voltage indicative of a voltage across a second resistance and selectively couples the second switch input to the second ADC input, wherein the ADC, in operation, outputs at the ADC output a signal indicative of a value of the second resistance. In an embodiment, the signal indicative of the value of the second resistance is a ratio of a value of the first voltage and a value of the second voltage. In an embodiment, said ADC comprises two negative feedback loops, which, in operation, function according to a value of the first switch output and a value of the second switch output. In an embodiment, said two negative feedback loops comprise first-order continuous-time sigma-delta converters. In an embodiment, in operation, alternatively one or the other of the two sigma-delta converters has a constant digital output at a level of 1. In an embodiment, the ADC comprises an integrator, and each sigma-delta converter comprises a comparator and a sequential electronic circuit coupled to the integrator. In an embodiment, said sequential electronic circuits are D flip-flops. In an embodiment, said first switch and said second switch are multiplexers having respective selection inputs coupled to respective outputs of said sequential electronic circuits of the sigma-delta converters, and, in operation, the outputs of the sequential electronic circuits provide negative feedback of the negative feedback loops. In an embodiment, the device comprises: low-pass filters coupled to respective outputs of said sequential electronic circuits; and a digital divider having respective inputs coupled to respective outputs of the low-pass filters, wherein the digital divider, in operation, outputs a digital representation of the value of the second resistance as a ratio between values representing said first voltage and said second voltage. In an embodiment, the device comprises: a comparator, wherein, said first switch comprises a third switch input, and, in operation the third switch input receives the second voltage and the first switch selectively couples the third switch input to the first ADC input; said second switch comprises a fourth switch input, and, in operation the fourth switch input receives the first voltage and the second switch selectively couples the fourth switch input to the second ADC input; and the comparator, in operation, compares the first voltage and the second voltage and generates a signal to control the first and second switches based on the comparison. In an embodiment, said first and second switches comprise first multiplexers having selection inputs coupled to an output of the comparator. In an embodiment, the ADC, in operation, generates a signal based on a ratio of a voltage at the first input of the ADC and a voltage at the second input of the ADC. In an embodiment, the device comprises: two second multiplexers each having: an input coupled to the ADC output; an input which, in operation, is fixed at a value of 1; and a selection input coupled to the output of the comparator. In an embodiment, the device comprises: a digital-divider having inputs coupled to respective outputs of the second multiplexers, wherein in operation, the digital divider generates a digital representation of a value of the second resistance. In an embodiment, the device comprises: a digital divider having an input coupled to the output of the ADC; and an output multiplexer having a first input coupled to the output of the ADC, a second input coupled to an output of the digital divider, and a selection input coupled to an output of the comparator.

In an embodiment, a system comprises: a sensor including a variable resistor; and circuitry coupled to the sensor, which, in operation, generates a signal indicative of a resistance of the variable resistor, the circuitry comprising: an analog to digital converter (ADC) having first ADC input, a second ADC input and an ADC output; a first switch having a first switch input and a first switch output and which, in operation, receives at the first switch input a reference voltage and selectively couples the first switch input to the first ADC input; a second switch having a second switch input and a second switch output and which, in operation, receives at the second switch input a second voltage indicative of a voltage across the variable resistor and selectively couples the second switch input to the second ADC input. In an embodiment, the signal indicative of the resistance of the variable resistor is a ratio of a value of the reference voltage and a value of the second voltage. In an embodiment, said ADC comprises: an integrator; and two negative feedback loops, said two negative feedback loops being first-order continuous-time sigma-delta converters having a comparator and a sequential electronic circuit coupled to the integrator. In an embodiment, said first switch and said second switch are multiplexers having respective selection inputs coupled to respective outputs of said sequential electronic circuits of the sigma-delta converters, and, in operation, the outputs of the sequential electronic circuits provide negative feedback of the negative feedback loops. In an embodiment, the circuitry comprises: low-pass filters coupled to respective outputs of said sequential electronic circuits; and a digital divider having respective inputs coupled to respective outputs of the low-pass filters, wherein the digital divider, in operation, outputs a digital signal indicative of the resistance of the variable resistor. In an embodiment, the circuitry comprises: a comparator, wherein, said first switch comprises a third switch input, and, in operation the third switch input receives the second voltage and the first switch selectively couples the third switch input to the first ADC input; said second switch comprises a fourth switch input, and, in operation the fourth switch input receives the reference voltage and the second switch selectively couples the fourth switch input to the second ADC input; and the comparator, in operation, compares the reference voltage and the second voltage and generates a signal to control the first and second switches based on the comparison. In an embodiment, the circuitry comprises: two output multiplexers each having: an input coupled to the ADC output; an input which, in operation, is fixed at a value of 1; and a selection input coupled to the output of the comparator; and a digital-divider having inputs coupled to respective outputs of the output multiplexers, wherein in operation, the digital divider generates a digital representation of a resistance of the variable resistor. In an embodiment, the circuitry comprises: a digital divider having an input coupled to the output of the ADC; and an output multiplexer having a first input coupled to the output of the ADC, a second input coupled to an output of the digital divider, and a selection input coupled to an output of the comparator. In an embodiment, the sensor includes a reference resistor and the reference voltage is a voltage across the reference resistor.

In an embodiment, a method comprises: sensing a voltage across a variable resistance; selectively coupling the sensed voltage to a first input of an analog to digital converter (ADC); selectively coupling a reference voltage to a second input of the ADC; and generating a signal indicative of a value of the variable resistance as a ratio of a value of the sensed voltage and a value of the reference voltage. In an embodiment, said ADC comprises: an integrator; and two negative feedback loops, said two negative feedback loops being first-order continuous-time sigma-delta converters having a comparator and a sequential electronic circuit coupled to the integrator. In an embodiment, the method comprises: low-pass filtering output signals of said sequential electronic circuits, generating first and second filtered signals; and dividing, using a digital divider, the first filtered signal by the second filtered signal, generating a digital signal indicative of the resistance of the variable resistor. In an embodiment, the method comprises: selectively coupling the sensed voltage to the second input of the ADC; selectively coupled the reference voltage to the first input of the ADC; comparing the sensed voltage to the reference voltage; and controlling the selective coupling based on the comparing of the sensed voltage to the reference voltage. In an embodiment, the method comprises: selectively coupling one of an output of the ADC and a signal having a value of one to a first input of a digital divider; selectively coupling one of an output of the ADC and the signal having a value of one to a second input of the digital divider; and generating, using the digital divider, a digital signal indicative of the resistance of the variable resistor. In an embodiment, the method comprises: generating, using a digital divider, an inverse of a signal generated by the ADC; and selecting one of the signal generated by the ADC and the inverse of the signal generated by the ADC. In an embodiment, the method comprises: sensing the reference voltage.

BRIEF DESCRIPTION OF THE SEVERAL VIEWS OF THE DRAWINGS

One or more embodiments will now be described purely by way of non-limiting example, with reference to the annexed drawings, wherein.

DETAILED DESCRIPTION

In the ensuing description, one or more specific details are illustrated, aimed at enabling an in-depth understanding of various embodiments provided by way of example. The embodiments may be obtained without one or more of the above specific details, or else with other methods, components, materials, etc. In other cases, known structures, materials, or operations are not represented or described in detail so that certain aspects of the embodiments will not be obscured.

Reference to "an embodiment" or "one embodiment" in the context of the present description is intended to indicate that a particular configuration, structure, or characteristic described in relation to the embodiment is comprised in at least one embodiment. Hence, phrases such as "in an embodiment" or "in one embodiment", or the like, that may be present in one or more points of the present description do not necessarily refer to one and the same embodiment. Furthermore, particular configurations, structures, or characteristics may be combined in any adequate way in one or more embodiments.

The references used herein are provided simply for convenience and hence do not define the sphere of protection or the scope of the embodiments.

An embodiment facilitates exploiting an efficient architecture for implementing the function described above with reference to FIG. 1.

In particular, in the ensuing description, various embodiments will be described to enable understanding of the example embodiments described. In what follows, the various embodiments will be described at the level of conceptual block diagram and at the level of implementation. In an embodiment, there will be two different circuits for two different situations, for $R_X < R_{REF}$ or for $R_X > R_{REF}$. The two conditions of the relation between the resistances being treated in different ways.

Figure 2B:
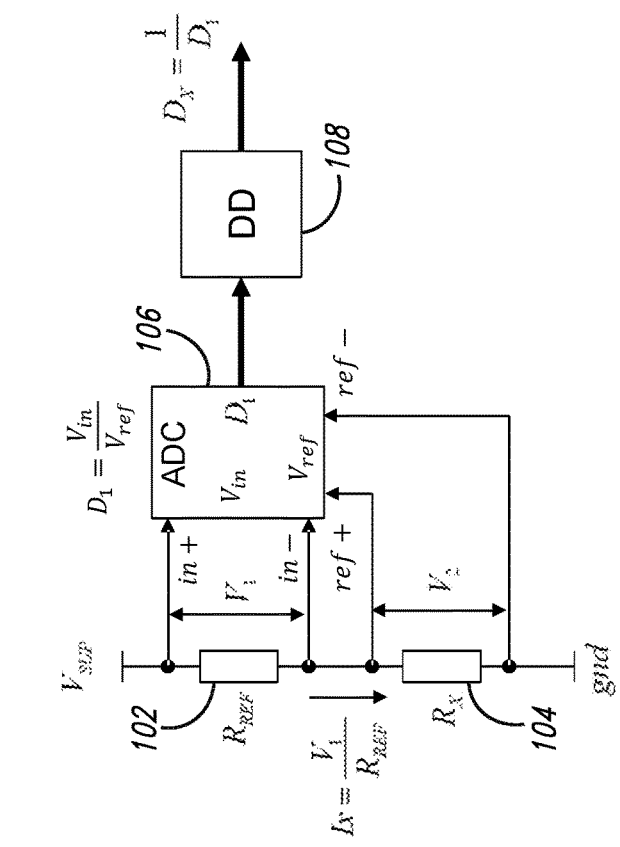
FIGS. 2A and 2B are functional block diagrams of embodiments of resistive sensor systems.
Figure 2A:
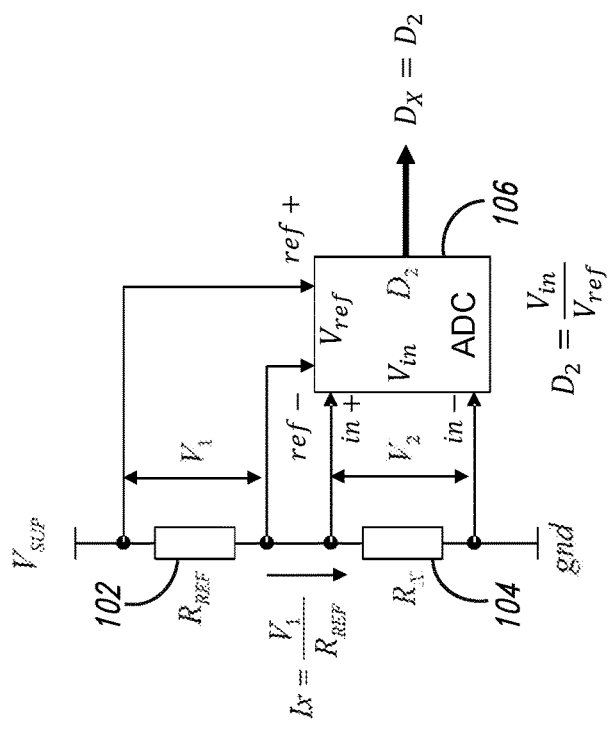

FIGS. 2A and 2B provide two different diagrams for the aforesaid two different conditions of relation between the unknown resistance $R_X$ 104 and the reference resistance $R_{REF}$ 102.

In particular, FIG. 2A regards the case where the unknown resistance $R_X$ 104 is lower than the reference resistance $R_{REF}$ 102 ($R_X < R_{REF}$), whereas FIG. 2B refers to the opposite case where the unknown resistance $R_X$ 104 is higher than the reference resistance $R_{REF}$ 102 ($R_X > R_{REF}$).

In the case represented in FIG. 2A, $R_X < R_{REF}$, the voltage V2 across $R_X$ 104 will be lower than the voltage V1 across the resistance $R_{REF}$ 102.

In these conditions, the circuit represented converts into a digital value the voltage V2 across the unknown resistance $R_X$, taking as reference the voltage V1 across the known reference resistance $R_{REF}$. The output of the analog-to-digital converter ADC 106 in this case reproduces directly the digital representation $D_X$ of the unknown resistance $R_X$.

In particular, in this case, the voltage V1 across the reference resistance $R_{REF}$ is sent at input to the analog-to-digital converter ADC 106 between the inputs Vref, and in particular between ref+ and ref−.

Instead, the voltage V2 measured across the unknown resistance $R_X$ is sent to the inputs Vin, between in+ and in−.

In particular, with reference to FIG. 2A the following equations may be written:

$$D2 = \frac{Vin}{Vref}$$

$$R_x = R_{REF} \frac{V2}{V1} = R_{REF} \frac{Vin}{Vref} = R_{REF} \cdot D2$$

where $D_X = D2$.

In the second case, where the unknown resistance $R_X$ is higher than the reference resistance $R_{REF}$ ($R_X > R_{REF}$), the circuit of FIG. 2B converts into a digital value the voltage V1 across the known reference resistance $R_{REF}$, taking as reference the voltage V2 across the unknown resistance $R_X$. The digital divider DD 108 in this case calculates the digital representation $D_X$ of the unknown resistance $R_X$.

In particular, with reference to FIG. 2B, the following equations may be written:

$$D1 = \frac{Vin}{Vref}$$

$$R_X = R_{REF} \frac{V2}{V1} = R_{REF} \frac{Vref}{Vin} = R_{REF} \cdot \frac{1}{D1}$$

where $D_X = \frac{1}{D1}$.

Figure 1:
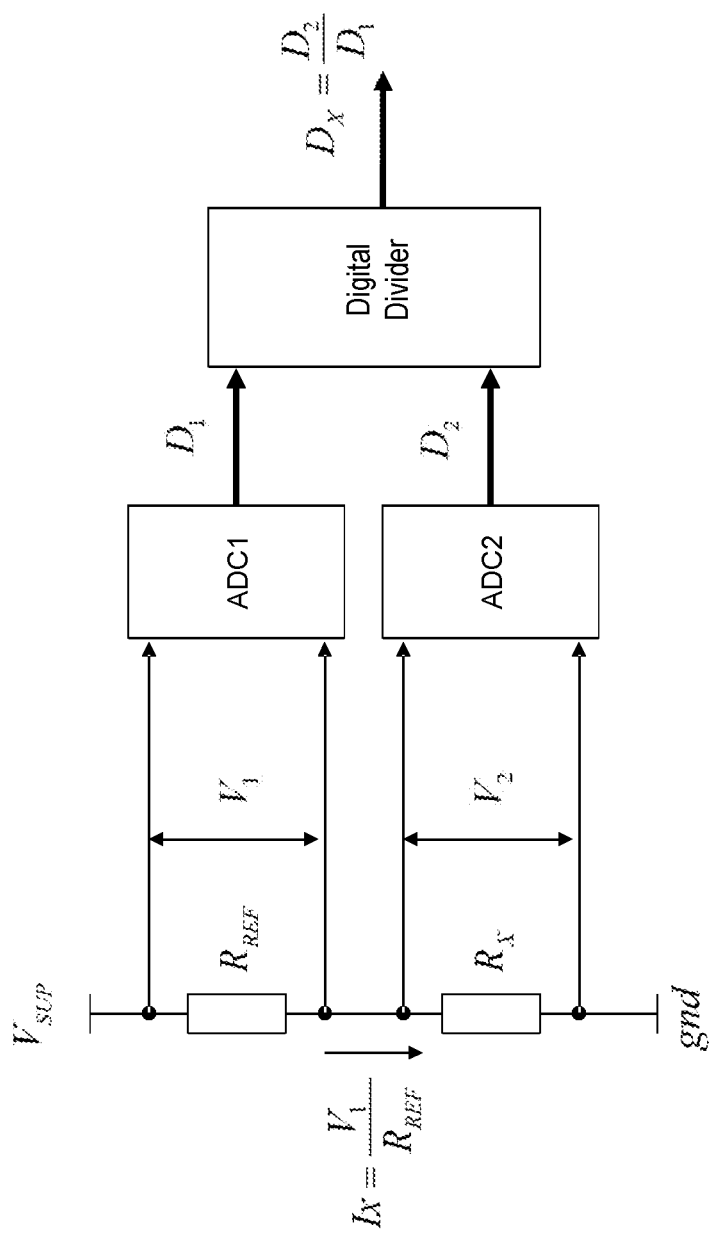
FIG. 1, which regards the prior art, has already been described.

This embodiment facilitates using fewer analog-to-digital operations and providing greater accuracy and precision as compared to the embodiment of FIG. 1.

In greater detail, the two cases just described with reference to FIGS. 2A and 2B differ from one another as regards the way in which the two voltages acquired across the two resistances $R_X$ 104 and $R_{REF}$ 102 are sent at input to the converter ADC 106.

The converter employs a reference voltage for calculating a ratio between voltages.

In the first case, when $R_X<R_{REF}$, the inputs to the converter ADC are chosen in such a way that Vin is set equal to V2, to the voltage measured across $R_X$, whereas Vref is set equal to V1, the voltage measured across $R_{REF}$.

In the second case, when $R_X>R_{REF}$, the inputs to the converter ADC are chosen in an opposite way; namely, Vin is set equal to V1, to the voltage measured across $R_{REF}$, whereas Vref is set equal to V2, the voltage measured across $R_X$.

In an embodiment, a device for measuring an unknown resistance $R_X$ comprises a reference resistance $R_{REF}$ in series with the unknown resistance $R_X$. The device measures a first voltage V1 and a second voltage V2 across the reference resistance $R_{REF}$ and the unknown resistance $R_X$, respectively. In an embodiment, the device comprises changeover-switch modules, which receive at input the voltages and return values representing the voltages. In an embodiment, the device comprises a single analog-to-digital converter ADC, which supplies at output the digital representation $D_X$ of the value of the unknown resistance $R_X$ as a ratio between the values V1, V2 at input to the converter ADC.

Figure 3:
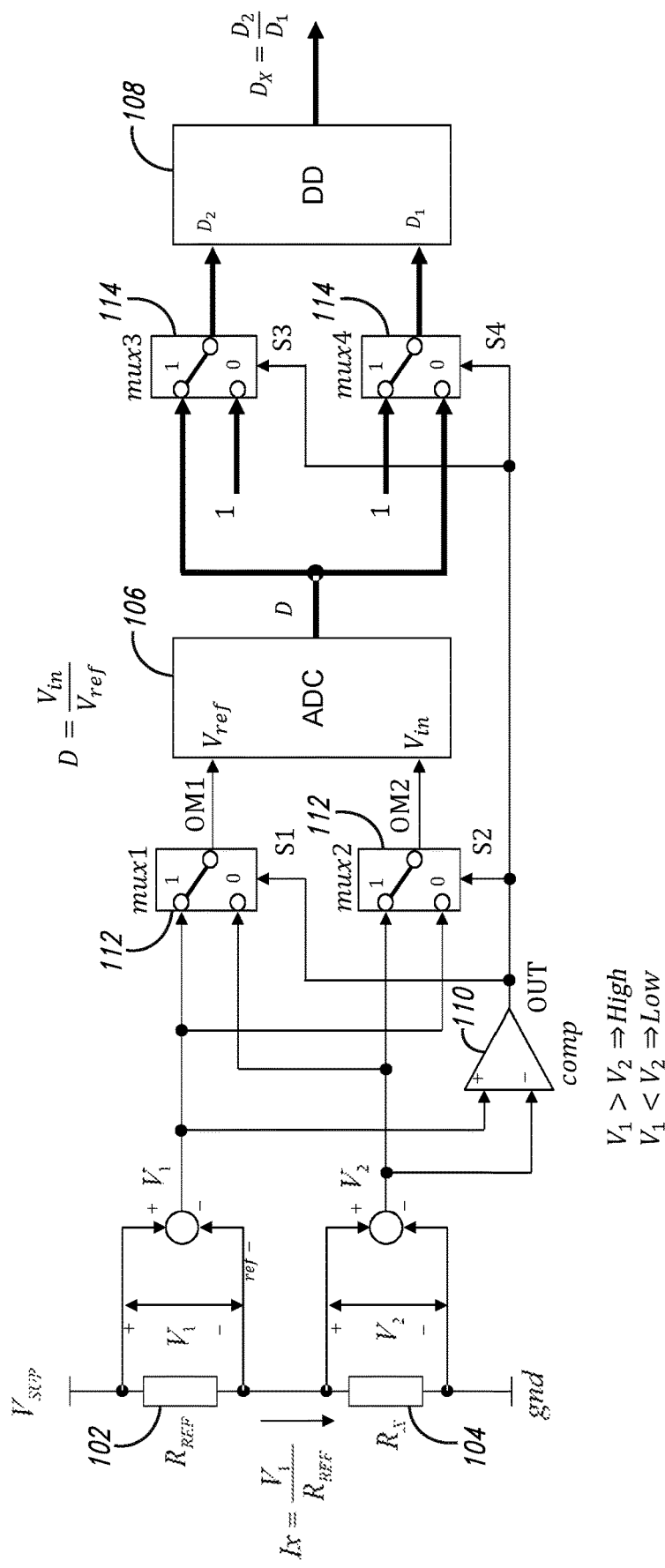
FIG. 3 shows an architecture of an embodiment of a resistive sensor system.

FIG. 3 shows an architecture of an embodiment, which also comprises a comparator block comp 110, which compares the voltage V1 with the voltage V2 to decide whether the relation between the resistances falls in the first case ($R_X<R_{REF}$) or else in the second case ($R_X>R_{REF}$).

The architecture of FIG. 3 further comprises a plurality of changeover switches 112 that couple the converter ADC 106 according to the two cases.

The two resistances $R_X$ 102 and $R_{REF}$ 104 are coupled together in series between ground gnd and the supply voltage $V_{SUP}$ as indicated in FIG. 3. Measured across the reference resistance $R_{REF}$ is the voltage V1, which is proportional to the value of the resistance $R_{REF}$. In particular, the current that reaches the unknown resistance $R_X$ is equal to $$I_X = \frac{V1}{R_{REF}}.$$

Consequently, we have that:
the two resistances have the same current $I(R_{REF})=I(R_X)=I_X$;
the voltage V1 is the voltage across $R_{REF}$; and
the voltage V2 is the voltage across $R_X$.

Generally, present between the two resistances there may be a transistor (not shown) with function of electronic switch, which has a certain value of resistance. This resistance does not present drawbacks provided that the three conditions referred to above are respected.

The two voltages V1 and V2 measured across the resistances are sent at input to a comparator comp 110, which supplies at output OUT a high value (HIGH corresponding to the logic value "1") when the voltage V1 is higher than the voltage V2 (V1>V2) and supplies a low value (LOW corresponding to the logic value "0") when the voltage V1 is lower than the voltage V2 (V1<V2).

The output OUT of the comparator comp 110 is sent, together with the two values V1 and V2, at input to two multiplexers mux1 112 and mux2 112, and the output OUT of the comparator comp 110 drives the selection terminal of the aforesaid multiplexers 112.

When the output OUT is at a high level "1", the output of the multiplexer mux is equal to the first input (V1 for the multiplexer mux1 at the top in FIG. 3 and V2 for the multiplexer mux2 at the bottom). Instead, when the output OUT is at the low level "0", the output of the multiplexer mux is equal to the second input (V2 for the multiplexer mux1 at the top in FIG. 3 and V1 for the multiplexer mux2 at the bottom).

The outputs of the multiplexers OM1 and OM2 are supplied to the converter ADC 106. In particular OM1 is supplied to the input Vref, whereas OM2 is supplied to the input Vin. The output D of the converter ADC (which is equal to $$D = \frac{Vin}{Vref}$$

is sent at input to other two multiplexers mux3 114 and mux4 114.

These second multiplexers 114 have one input fixed at the value "1", and as selection input receive the output OUT of the comparator comp 110. In this case, the value "1" is a binary number with as many bits as the number of bits of the output of the ADC. If the latter has 10 bits, then "1" of FIG. 3 is the binary number "0000 0000 01".

In particular, the multiplexer mux3 receives, as first input, the output D of the converter ADC 106 and, as second input, the constant value "1". Instead, the multiplexer mux4 receives, as first input, the constant value "1" and, as second input, the output D of the converter ADC 106.

At output from the multiplexer mux3 there is the value D2, and at output from the multiplexer mux4 there is the value D1. These two values are sent at input to a digital divider DD 108, which supplies at output the value of $D_X$ calculated as $$D_X = \frac{D2}{D1}.$$

In particular, when the signal OUT at output from the comparator is high "1" (OUT=1), when V1>V2 (event that occurs when the unknown resistance $R_X$ is lower than the reference resistance $R_{REF}$), the selector signals S3 and S4 are equal to "1" and enable transfer at output of the signal set on the first input of the multiplexers. Consequently, at output from the multiplexer mux 3 there is the value D, whereas at output from the multiplexer mux 4 there is the value "1". Consequently, the digital divider DD supplies at output the ratio between D2 and D1, where in this case D1=1, $$D_X = \frac{D2}{D1} = D2.$$

In particular, the switches inside the multiplexers mux3 and mux4 are in the position indicated in FIG. 3; they enable transfer at output of the value present on the first input of the multiplexers.

Instead, when the signal OUT at output from the comparator is low "0", when V1<V2 (event that occurs when the unknown resistance $R_X$ is higher than the reference resistance $R_{REF}$), the selector signals S3 and S4 are equal to "0" and enable transfer at output of the signal set on the second input of the multiplexers. Hence, at output from the multiplexer mux3 there is the value "1", whereas at output from the multiplexer mux4 there is the value D. Consequently, the digital divider DD supplies at output the ratio between D2 and D1, where in this case D2=1, $$D_X = \frac{D2}{D1} = \frac{1}{D1}.$$

In this case, the switches inside the multiplexers mux3 and mux4 are in a position opposite to the one represented in FIG. 3; they enable transfer at output of the value present on the second input of the multiplexers.

Consequently, the architecture represented in FIG. 3 comprises the functions of the two circuits of FIG. 2 that are each specific for a particular case of relation between the resistances $R_X$ and $R_{REF}$.

With this single architecture, it is consequently possible to measure the unknown resistance $R_X$, which represents the value that is to be measured by means of the sensor.

In particular, these sensors measure the variation of electrical resistance as a function of the physical quantity to be measured. In particular, for example in measuring a level of liquid, the higher the level of liquid, the higher the value of the unknown resistance $R_X$ measured. This measurement is made on the basis of a reference resistance $R_{REF}$ of a known value.

To sum up, when $R_X<R_{REF}$, we have:

$$D2 = \frac{Vin}{Vref}$$

$$R_x = R_{REF}\frac{V2}{V1} = R_{REF}\frac{Vin}{Vref} = R_{REF} \cdot D2 = R_{REF} \cdot D_X$$

$$\text{where } D2 = \frac{Vin}{Vref} \text{ and } D_X = D2,$$

whereas, when $R_X>R_{REF}$, we have:

$$R_x = R_{REF}\frac{V2}{V1} = R_{REF}\frac{Vref}{Vin} = R_{REF} \cdot \frac{1}{D1} = R_{REF} \cdot D_X$$

$$\text{where } D1 = \frac{Vin}{Vref} \text{ and } D_X = \frac{1}{D1}.$$

In this case, when V1≅V2, the multiplexers may switch too fast, and problems may arise.

Figure 4:
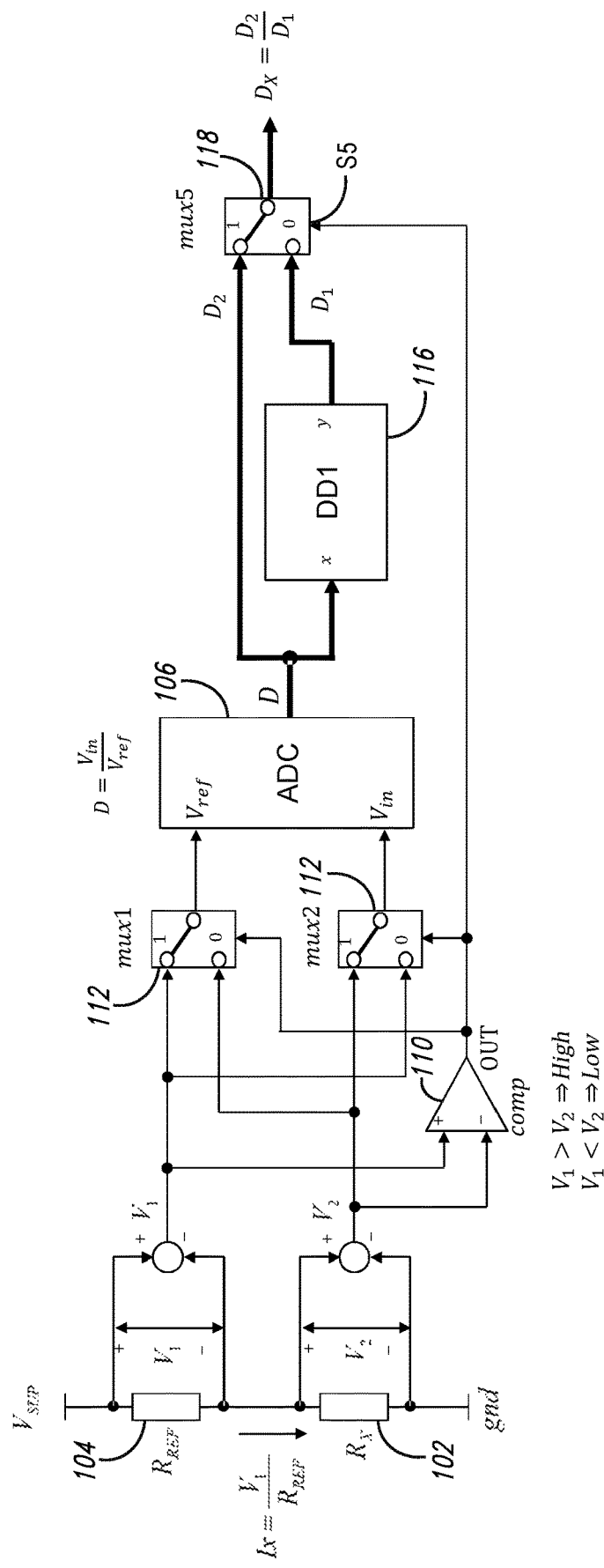
FIG. 4 shows a variant of the embodiment of FIG. 3.

FIG. 4 shows an embodiment alternative to the one illustrated in FIG. 3.

The first part of the architecture as illustrated is identical to that of FIG. 3, whereas the second part varies.

In particular, in this embodiment, the divider DD1 116 is shifted upstream, and just one multiplexer mux5 118 is used at output.

In particular, the divider DD1 116 supplies at output the inverse of the input, namely, $$y = \frac{1}{x}.$$

In this embodiment, the output D of the converter ADC 106 is sent directly, as first input (D2), to the multiplexer mux5 118, and is sent at input to the divider DD1 116.

The output of the divider DD1 116 is $$D1 = \frac{1}{D}$$

and is sent, as second input, to the multiplexer mux5 118. The output of the multiplexer mux5 118 is driven by the selection input S5, which is connected to the output OUT of the comparator comp 110. When the output OUT of the comparator comp 110 is at the high value "1" (when V1>V2, and $R_X<R_{REF}$) the output of the multiplexer mux5 118 is connected to the top input D2=D (as viewed in the figure).

Instead, when the output OUT of the comparator comp is at the low value "0" (when V1<V2, and $R_X>R_{REF}$), the output of the multiplexer mux5 118 is connected to the bottom input $$D1 = \frac{1}{D}$$

(as viewed in the figure).

Also in this case, the same equations as the ones written for the embodiment of FIG. 3 apply.

Figure 5:
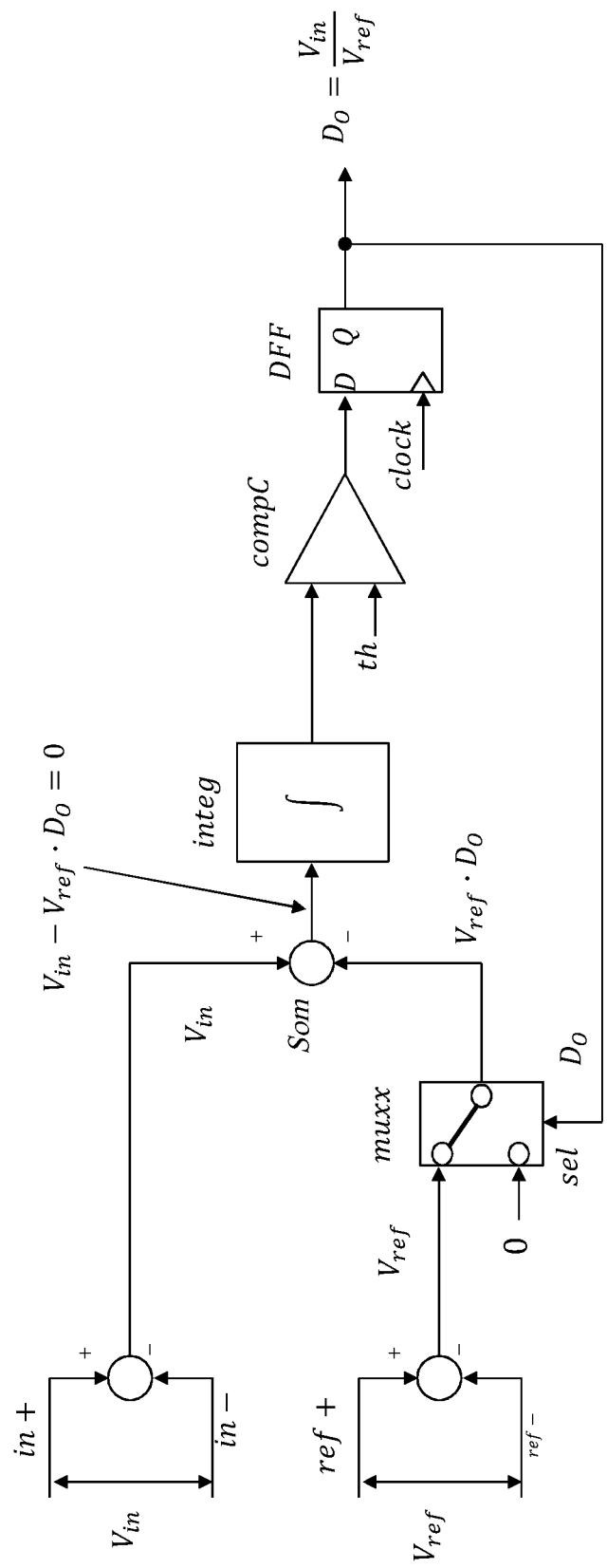
FIG. 5 shows a functional block diagram of a known sigma-delta converter.

FIG. 5 shows one of various embodiments of a known ΣΔ analog-to-digital converter module with a first-order continuous-time ΣΔ modulator.

Figure 6:
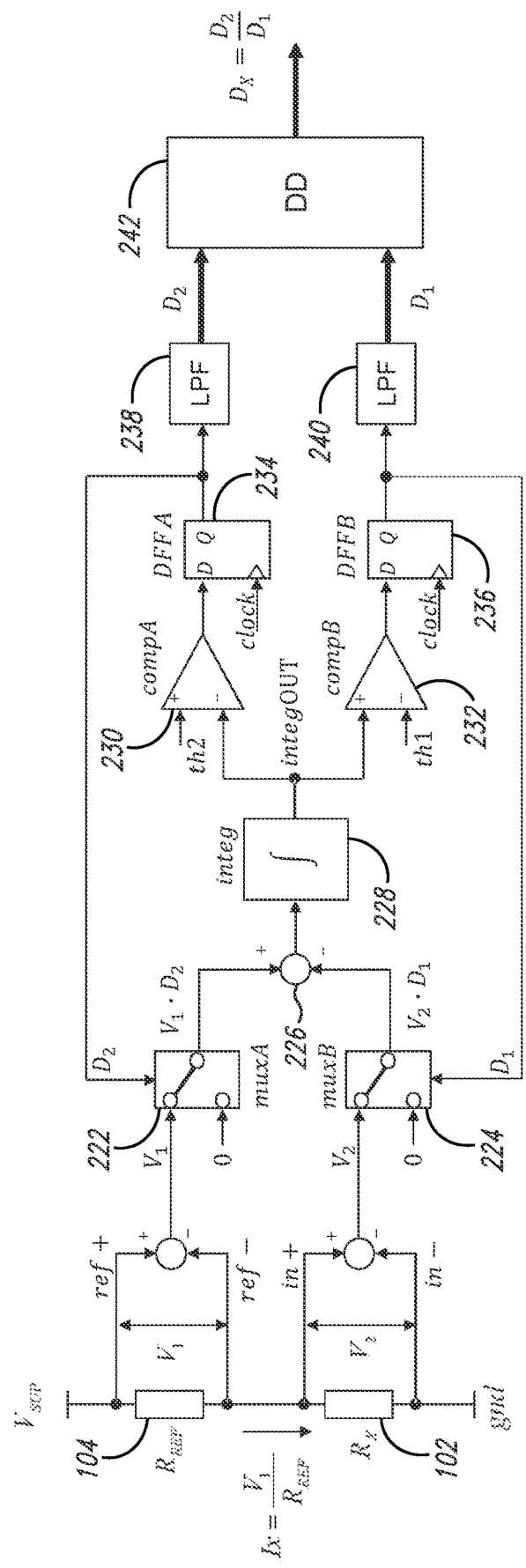
FIG. 6 shows an embodiment of a sigma-delta converter.

Consequently, illustrated in FIG. 5 is one of the possible representations, by means of a block diagram, of a first-order continuous-time sigma-delta converter module, in which the representation of the various blocks is useful for understanding operation of an embodiment of an architecture here proposed and represented in FIG. 6.

The converter module comprises a negative feedback loop. The integrator module integ has a zero-mean input, an infinite DC gain, and is included in the negative feedback loop.

In particular, the module envisages measuring at input the two voltages Vin and Vref.

The voltage Vref measured across the reference resistance $R_{REF}$ is sent, as first input, to a multiplexer muxx. The second input of the multiplexer muxx receives the zero value "0", and the selection input sel receives the value D0 as feedback of the circuit. The output of the multiplexer muxx is equal to (Vref·D0). If D0 is at the low level "0", the output is zero "0".

The two voltages Vin and (Vref·D0) are sent at input to an adder node Som, where Vin is sent with positive sign, whereas (Vref·D0) with negative sign. The output of the adder node Som, equal to Vin−(Vref·D0)=0, is sent at input to an integrator node integ, which supplies at output a nonzero value due to its infinite amplification factor. The output of the integrator integOUT is sent at input to a comparator compC for comparison with a threshold value th set on the other input of the comparator.

The output of the comparator compC is sent at input to the data terminal D of a sequential electronic circuit (D flip-flop). The flip-flop has a data input D, a clock synchronization input, and an output Q. Upon switching of the clock signal, the D flip-flop transfers the value on the terminal input D at output Q and holds it until the aforesaid input changes according to the characteristic equation: Q+=D. The output Q of the flip-flop is equal to $$D0 = \frac{Vin}{Vref}$$

and is sent back as feedback to the multiplexer muxx and used as selection input sel. In particular, the sequential electronic circuit (D flip-flop) provides a fast elementary memory device.

Consequently, this sigma-delta converter contains just one feedback loop and supplies just one output, which represents the digital conversion of the input voltage Vin.

Starting from this known ΣΔ analog-to-digital converter module, illustrated in FIG. 5 in one of its possible representations, it is possible to arrive at a modified converter for use in an embodiment for measuring an unknown resistance.

FIG. 6 illustrates an embodiment of a modified converter.

As already mentioned previously, the two resistances $R_{REF}$ 104 and $R_X$ 102 are coupled together in series between the supply voltage $V_{SUP}$ and the ground terminal gnd. The two respective voltages, V1 and V2, are measured across the resistances. The two voltages measured are sent to the first input of two respective multiplexers, in particular muxA 222 and muxB 224. Sent at input to the second terminal of the multiplexer muxA 222 and muxB 224 is the zero value "0".

Furthermore, the two multiplexers muxA and muxB receive on the selection terminal the two feedback signals D2 and D1. In particular, the signal D2 controls the output of the multiplexer muxA 222, whereas the signal D1 controls the output of the multiplexer muxB 224.

As already said previously, the value of the signal on the selection input enables transfer at output of one of the two signals present on the two input terminals to the multiplexer. For example, when the selection signal is equal to "1", the multiplexer supplies at output the value of the signal present on the first input.

Consequently, at output from the multiplexers muxA 222 and muxB 224 there will be the values V1·D2 and V2·D1. These two values are sent to an adder node 226, the second with negative sign. The output of the adder node 226 ((V1·D2)−(V2·D1)) is sent at input to the integrator integ 228.

We have V1·D2=V2·D1 in so far as the input of the integrator integ 228 is equal to zero.

The input of the integrator integ 228 is on average zero because the integrator has an infinite gain and is set in a negative feedback loop. Like an operational amplifier, it has a differential input voltage that is zero when it is properly inserted in a feedback loop. The output voltage of the integrator 228 instead is not zero by virtue of its infinite amplification factor.

The output of the integrator integOUT is sent at input to two comparators compA 230 and compB 232. In greater detail, the output integOUT of the integrator 228 is sent, as negative input, to the comparator compA 230, which compares it with a threshold th2, and moreover the output integOUT of the integrator 228 is set also, as positive input, to the comparator compB 232, which compares it with a threshold th1.

The outputs of the comparators are sent at input to two D flip-flops DFFA 234 and DFFB 236, on the data input D. The outputs of these flip-flops are filtered by two low-pass filters LPF 238, 240, and the filtered values represent D2 and D1, respectively. These values are also sent at input as selection values for the two multiplexers muxA 222 and muxB 224.

Finally, the values D2 and D1 obtained are sent to a digital divider DD 242, which calculates the ratio $$D_X = \frac{D2}{D1}.$$

Consequently, in the case where $R_X < R_{REF}$, we have V2<V1.

Hence, D1=1 since the output integOUT of the integrator 228 reaches the threshold th2, and the ripple of the output of the integrator 228 is lower than th2−th1.

Consequently, V1·D2=V2 because the input of the integrator 228 is zero, equal to "0".

Thus, we can write:

$$R_x = R_{REF} \frac{V2}{V1} = R_{REF} D2 = R_{REF} D2$$

$$\text{where } D_X = D2$$

thus obtaining the same result as for the previous embodiments.

Furthermore, in the case where $R_X > R_{REF}$, we have V2>V1.

Hence, D2=1 since the output of the integrator integ 228 reaches the threshold th1 and the ripple of the output of the integrator 228 is less than th2−th1.

Consequently, V1=V2 because the input of the integrator 228 is zero, equal to "0".

Thus, we can write:

$$R_x = R_{REF} \frac{V2}{V1} = R_{REF} \frac{1}{D1} = R_{REF} D_X$$

$$\text{where } D_X = \frac{1}{D1}$$

thus obtaining the same result as for the previous embodiments.

Figure 7:
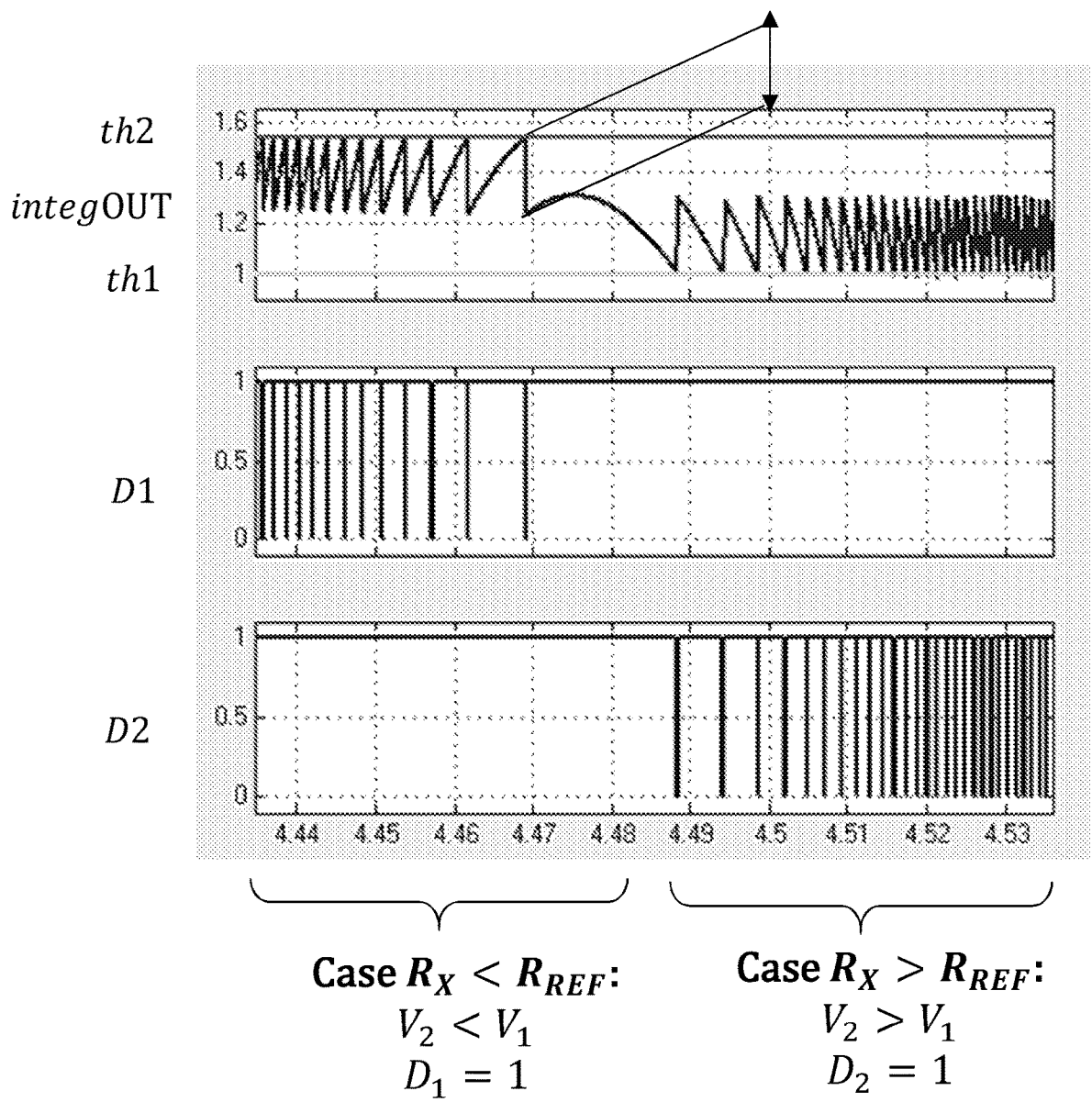
FIG. 7 shows example diagrams representing the ripple on the output of the integrator present in the embodiment of a converter of FIG. 6.

Reproduced in FIG. 7 are the plots representing the ripple of the output integOUT of the integrator 228 (where the thresholds th1 and th2 are indicated) and the plots of the values of D2 and of D1 according to the values of the resistances. In particular, appearing on the left is the case $R_X < R_{REF}$ and appearing on the right is the case $R_X > R_{REF}$.

In an embodiment, a ripple will be smaller than the difference between the two thresholds (ripple<th2−th1), a variability less than the difference between the thresholds.

The condition ripple<th1−th2 may be useful because one of the two terms of the division is 1, thus facilitating improving the efficiency of the calculations. If this condition were not satisfied, there would in any case be proper operation, but possibly without optimization of a term=1.

Consequently, the solution illustrated in FIGS. 2A and 2B has been introduced to explain working principles and derive the formulas useful for explaining an embodiment, whereas FIG. 6 shows an example of a possible embodiment that is equivalent to that of FIGS. 2A and 2B because it uses the same formulas. Just a glance at the formulas reveals that the two solutions perform the same function.

Instead, with reference to the known sigma-delta converter of FIG. 5, which contains just one loop and supplies just one output that represents the digital conversion of the input voltage, the solution proposed in FIG. 6 contains two loops that function in an alternative way. In an embodiment, one of the two has a digital output equal to 1, whereas the other functions as the loop of the known sigma-delta converter.

In particular, there are two feedback loops, two comparators, and two outputs that sense the output of the integrator integ 228 and are sent back at input.

If one of the two inputs is equal to 1 this may facilitate maximizing the precision.

Consequently, we have that only one of the two thresholds at a time is stimulated, and hence the outputs are a datum that changes and a constant datum equal to "1".

The embodiment described represents an implementation of a concept expressed by the embodiment described in FIGS. 2A and 2B that is efficient from the standpoint of performance and from the economic standpoint.

In an embodiment, the concepts of FIGS. 2A and 2B are implemented respecting the advantage of a single A/D converter, of a sigma-delta type, which that presents high efficiency and performance using silicon integration technologies. Finally, an embodiment manages in a simple and effective way transition between the two cases V2<V1, and vice versa, and facilitates doing so without malfunctioning in the case of multiple transitions close to one another in time.

An embodiment described herein envisages a single sigma-delta converter, which generates two different outputs, which are sent to the logic for being processed with two digital filters. In an embodiment, one of the two is constant at the high value.

In an embodiment, a device for measuring an unknown resistance comprises a single analog-to-digital converter, which contains two negative feedback loops that function in an alternative way according to the outputs of the changeover-switch modules upstream of the converter.

In an embodiment, the two negative feedback loops are first-order continuous-time sigma-delta converters. Typically, one or the other, alternatively, of the two sigma-delta converters has its digital output constant at the high level.

Each sigma-delta converter comprises an integrator 228, a comparator, and a sequential electronic circuit. In an embodiment, the sequential electronic circuits are D flip-flops, and the changeover-switch modules are multiplexers. Furthermore, the outputs of the sequential electronic circuits are sent back at input as negative feedback and used as selection input of the multiplexers. The outputs of the sequential electronic circuits are filtered with low-pass filters and sent at input to a digital divider, which supplies at output the digital representation of the value of the unknown resistance.

Of course, the details of construction and the embodiments may vary widely with respect to what has been described and illustrated herein purely by way of example, without thereby departing from the scope of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
an analog to digital converter (ADC) having first ADC input, a second ADC input and an ADC output;
a first switch having a first switch input and a first switch output and which, in operation, receives at the first switch input a first voltage indicative of a voltage across a first resistance and selectively couples the first switch input to the first ADC input; and
a second switch having a second switch input and a second switch output and which, in operation, receives at the second switch input a second voltage indicative of a voltage across a second resistance and selectively couples the second switch input to the second ADC input, wherein the ADC, in operation, outputs at the ADC output a signal indicative of a value of the second resistance, wherein:
said ADC comprises two negative feedback loops, which, in operation, function according to a value of the first switch output and a value of the second switch output,
said two negative feedback loops comprise first-order continuous-time sigma-delta converters,
the ADC comprises an integrator, and each sigma-delta converter comprises a comparator and a sequential electronic circuit coupled to the integrator, and
said first switch and said second switch are multiplexers having respective selection inputs coupled to respective outputs of said sequential electronic circuits of the sigma-delta converters, and, in operation, the outputs of the sequential electronic circuits provide negative feedback of the negative feedback loops.

2. The device of claim 1 wherein the signal indicative of the value of the second resistance is a ratio of a value of the first voltage and a value of the second voltage.

3. The device of claim 1 wherein said sequential electronic circuits are D flip-flops.

4. A device, comprising:
an analog to digital converter (ADC) having first ADC input, a second ADC input and an ADC output, wherein the ADC includes an integrator and two negative feedback loops comprising first-order continuous-time sigma-delta converters, each sigma-delta converter comprising a comparator and a sequential electronic circuit coupled to the integrator;
a first switch having a first switch input and a first switch output and which, in operation, receives at the first switch input a first voltage indicative of a voltage across a first resistance and selectively couples the first switch input to the first ADC input; and
a second switch having a second switch input and a second switch output and which, in operation, receives at the second switch input a second voltage indicative of a voltage across a second resistance and selectively couples the second switch input to the second ADC input, wherein the ADC, in operation, outputs at the ADC output a signal indicative of a value of the second resistance, and the two negative feedback loops, in operation, function according to a value of the first switch output and a value of the second switch output, and wherein the device comprises:
low-pass filters coupled to respective outputs of said sequential electronic circuits; and
a digital divider having respective inputs coupled to respective outputs of the low-pass filters, wherein the digital divider, in operation, outputs a digital representation of the value of the second resistance as a ratio between values representing said first voltage and said second voltage.

5. The device according to claim 4 wherein said first switch and said second switch are multiplexers having respective selection inputs coupled to respective outputs of said sequential electronic circuits of the sigma-delta converters, and, in operation, the outputs of the sequential electronic circuits provide negative feedback of the negative feedback loops.

6. A system, comprising:
a sensor including a variable resistor; and
circuitry coupled to the sensor, which, in operation, generates a signal indicative of a resistance of the variable resistor, the circuitry comprising:
an analog to digital converter (ADC) having first ADC input, a second ADC input and an ADC output;
a first switch having a first switch input and a first switch output and which, in operation, receives at the first switch input a reference voltage and selectively couples the first switch input to the first ADC input; and
a second switch having a second switch input and a second switch output and which, in operation, receives at the second switch input a second voltage indicative of a voltage across the variable resistor and selectively couples the second switch input to the second ADC input, wherein
said ADC comprises:
an integrator; and
two negative feedback loops, said two negative feedback loops being first-order continuous-time sigma-delta converters having a comparator and a sequential electronic circuit coupled to the integrator; and
said first switch and said second switch are multiplexers having selection inputs coupled to respective outputs of said sequential electronic circuits of the sigma-delta converters, and, in operation, the outputs of the sequential electronic circuits provide negative feedback of the negative feedback loops.

7. The system of claim 6 wherein the circuitry comprises:
low-pass filters coupled to respective outputs of said sequential electronic circuits; and
a digital divider having inputs coupled to respective outputs of the low-pass filters, wherein the digital divider, in operation, outputs a digital signal indicative of the resistance of the variable resistor.

8. A system, comprising:
a sensor including a variable resistor; and
circuitry coupled to the sensor, which, in operation, generates a signal indicative of a resistance of the variable resistor, the circuitry comprising:
an analog to digital converter (ADC) having first ADC input, a second ADC input and an ADC output;
a first switch having a first switch input and a first switch output and which, in operation, receives at the first switch input a reference voltage and selectively couples the first switch input to the first ADC input; and
a second switch having a second switch input and a second switch output and which, in operation, receives at the second switch input a second voltage indicative of a voltage across the variable resistor and selectively couples the second switch input to the second ADC input, wherein
said ADC comprises:
an integrator; and
two negative feedback loops, said two negative feedback loops being first-order continuous-time sigma-delta converters having a comparator and a sequential electronic circuit coupled to the integrator; and
the circuitry comprises:
low-pass filters coupled to respective outputs of said sequential electronic circuits; and
a digital divider having inputs coupled to respective outputs of the low-pass filters, wherein the digital divider, in operation, outputs a digital signal indicative of the resistance of the variable resistor.

9. The system of claim 8 wherein said sequential electronic circuits are D flip-flops.

10. A device, comprising:
an analog to digital converter (ADC) having first ADC input, a second ADC input and an ADC output;
a first switch having a first switch input and a first switch output, wherein the first switch, in operation, receives at the first switch input a first voltage indicative of a voltage across a first resistance and selectively couples the first switch input to the first ADC input;
a second switch having a second switch input and a second switch output, wherein the second switch, in operation, receives at the second switch input a second voltage indicative of a voltage across a second resistance and selectively couples the second switch input to the second ADC input, wherein the ADC, in operation, outputs at the ADC output a signal indicative of a value of the second resistance;
first and second multiplexers, each having:
an input coupled to the ADC output;
an input, which, in operation, has a fixed value;
a selection input; and
a comparator, which in operation, compares the first voltage and the second voltage and generates a control signal based on the comparison, the comparator having an output coupled to the selection inputs of the first and second multiplexers.

11. The device of claim 10, comprising:
a digital-divider having inputs coupled to respective outputs of the first and second multiplexers, wherein in operation, the digital divider generates a digital representation of a value of the second resistance.

12. The device of claim 10 wherein, in operation, the first and second switches are controlled based on the control signal generated by the comparator.

13. The device of claim 12 wherein,
the first switch has a third switch input, and the first switch, in operation, receives at the third switch input the second voltage and selectively couples the third switch input to the first ADC input; and
the second switch has a fourth switch input, and the second switch, in operation, receives at the fourth switch input the first voltage and selectively couples the fourth switch input to the second ADC input.

14. A system, comprising:
a sensor including a variable resistor; and circuitry coupled to the sensor, which, in operation, generates a signal indicative of a resistance of the variable resistor, the circuitry comprising:
  an analog to digital converter (ADC) having first ADC input, a second ADC input and an ADC output;
  a first switch having a first switch input and a first switch output and which, in operation, receives at the first switch input a reference voltage and selectively couples the first switch input to the first ADC input;
  a second switch having a second switch input and a second switch output and which, in operation, receives at the second switch input a second voltage indicative of a voltage across the variable resistor and selectively couples the second switch input to the second ADC input;
  a comparator, which in operation, compares the reference voltage and the second voltage and generates a control signal based on the comparison; and
  two output multiplexers, each having an input coupled to the ADC output, an input, which, in operation, has a fixed value, and a selection input coupled to the output of the comparator.

15. The system of claim 14 wherein the circuitry comprises:
  a digital-divider having inputs coupled to respective outputs of the output multiplexers, wherein in operation, the digital divider generates a digital representation of a resistance of the variable resistor.

16. The system of claim 15 wherein, in operation, the first and second switches are controlled based on the control signal generated by the comparator.

17. A device, comprising:
  an analog to digital converter (ADC) having first ADC input, a second ADC input and an ADC output;
  a first switch having a first switch input and a first switch output, wherein the first switch, in operation, receives at the first switch input a first voltage indicative of a voltage across a first resistance and selectively couples the first switch input to the first ADC input;
  a second switch having a second switch input and a second switch output, wherein the second switch, in operation, receives at the second switch input a second voltage indicative of a voltage across a second resistance and selectively couples the second switch input to the second ADC input, wherein the ADC, in operation, outputs at the ADC output a signal indicative of a value of the second resistance;
  a comparator, which in operation, compares the first voltage and the second voltage and generates a control signal based on the comparison;
  a digital divider having an input coupled to the output of the ADC; and
  an output multiplexer having a first input coupled to the output of the ADC, a second input coupled to an output of the digital divider, and a selection input coupled to an output of the comparator.

18. The device of claim 17 wherein, in operation, the first and second switches are controlled based on the control signal generated by the comparator.

19. The device of claim 17 wherein,
  the first switch has a third switch input, and the first switch, in operation, receives at the third switch input the second voltage and selectively couples the third switch input to the first ADC input; and
  the second switch has a fourth switch input, and the second switch, in operation, receives at the fourth switch input the first voltage and selectively couples the fourth switch input to the second ADC input.

20. A system, comprising:
  a sensor including a variable resistor; and
  circuitry coupled to the sensor, which, in operation, generates a signal indicative of a resistance of the variable resistor, the circuitry comprising:
    an analog to digital converter (ADC) having first ADC input, a second ADC input and an ADC output;
    a first switch having a first switch input and a first switch output and which, in operation, receives at the first switch input a reference voltage and selectively couples the first switch input to the first ADC input;
    a second switch having a second switch input and a second switch output and which, in operation, receives at the second switch input a second voltage indicative of a voltage across the variable resistor and selectively couples the second switch input to the second ADC input;
    a comparator, which in operation, compares the reference voltage and the second voltage and generates a control signal based on the comparison;
    a digital divider having an input coupled to the output of the ADC; and
    an output multiplexer having a first input coupled to the output of the ADC, a second input coupled to an output of the digital divider, and a selection input coupled to an output of the comparator.

21. The system of claim 20 wherein, in operation, the first and second switches are controlled based on the control signal generated by the comparator.

22. The system of claim 20 wherein the sensor includes a reference resistor and the reference voltage is a voltage across the reference resistor.

* * * * *